(12) United States Patent
Ho

(10) Patent No.: US 10,741,750 B2
(45) Date of Patent: Aug. 11, 2020

(54) SEMICONDUCTOR STRUCTURE AND METHOD FOR MANUFACTURING THE SAME

(71) Applicant: NANYA TECHNOLOGY CORPORATION, New Taipei (TW)

(72) Inventor: Jar-Ming Ho, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/363,866

(22) Filed: Mar. 25, 2019

(65) Prior Publication Data

US 2020/0194665 A1 Jun. 18, 2020

Related U.S. Application Data

(60) Provisional application No. 62/779,165, filed on Dec. 13, 2018.

(51) Int. Cl.
*H01L 21/768* (2006.01)
*H01L 43/12* (2006.01)
*H01L 43/02* (2006.01)
*H01L 27/22* (2006.01)

(52) U.S. Cl.
CPC ........... *H01L 43/12* (2013.01); *H01L 27/222* (2013.01); *H01L 43/02* (2013.01)

(58) Field of Classification Search
CPC ........... H01L 21/76877; H01L 27/222; H01L 2924/14; H01L 2924/1434; H01L 25/0655; H01L 24/92; H01L 21/76802; H01L 21/481; H01L 2224/48227; H01L 2224/16238; H01L 24/05; H01L 24/08; H01L 24/03; H01L 24/09; H01L 27/2481; H01L 27/1052; H01L 23/3157

See application file for complete search history.

(56) References Cited

U.S. PATENT DOCUMENTS

| | | | |
|---|---|---|---|
| 2009/0068836 A1* | 3/2009 | Kim | H01L 21/76816 438/656 |
| 2012/0241882 A1* | 9/2012 | Moon | H01L 43/12 257/421 |
| 2018/0308897 A1 | 10/2018 | Annunziata et al. | |

* cited by examiner

*Primary Examiner* — Caridad Everhart
(74) *Attorney, Agent, or Firm* — Muncy, Geissler, Olds & Lowe, P.C.

(57) ABSTRACT

The present disclosure relates to a semiconductor structure and a method for manufacturing the same. The semiconductor structure includes a semiconductor substrate, a first pillar and a second pillar over the semiconductor substrate, an isolation layer over the semiconductor substrate, and a first contact pad and a second contact pad embedded in the isolation layer. A first upper surface of the first pillar is higher than a second upper surface of the second pillar. The first pillar and the second pillar are laterally surrounded by the isolation layer. The first contact pad is disposed over the first pillar. The second contact pad is disposed over the second pillar, and a first pad width of the first contact pad is not greater than a second pad width of the second contact pad.

12 Claims, 5 Drawing Sheets

SEMICONDUCTOR STRUCTURE AND METHOD FOR MANUFACTURING THE SAME

PRIORITY CLAIM AND CROSS REFERENCE

This application claims the priority benefit of U.S. provisional application Ser. No. 62/779,165, filed on Dec. 13, 2018. The entirety of the above-mentioned patent application is hereby incorporated by reference herein and made a part of this specification.

TECHNICAL FIELD

The present disclosure relates to a semiconductor structure and a method for manufacturing the same, and more particularly, to a semiconductor structure and a method including a self-etching process for manufacturing the same.

DISCUSSION OF THE BACKGROUND

Semiconductor devices are essential for many modern applications. With the advancement of electronic technology, semiconductor devices are steadily becoming smaller and smaller while providing greater functionality and including greater numbers of integrated circuits. Due to the miniaturized scale of semiconductor devices, the widths of contact pads over pillars are becoming shorter and shorter.

Complex structures and surface topography in the semiconductor devices may impact etching processes due to misalignment. Therefore, a method for forming contact pads that uses a self-aligned etching process and a depositing process is provided.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure comprises a semiconductor substrate; a first pillar and a is second pillar over the semiconductor substrate, wherein a first upper surface of the first pillar is higher than a second upper surface of the second pillar; an isolation layer over the semiconductor substrate, wherein the first pillar and the second pillar are laterally surrounded by the isolation layer; a first contact pad embedded in the isolation layer, wherein the first contact pad is disposed over the first pillar; and a second contact pad embedded in the isolation layer, wherein the second contact pad is disposed over the second pillar, and a first pad width of the first contact pad is not greater than a second pad width of the second contact pad.

In some embodiments, the semiconductor structure further includes an etch stop layer disposed between the semiconductor substrate and the isolation layer. The first pillar and the second pillar are laterally surrounded by the etch stop layer.

In some embodiments, the second pillar has a second pillar width that is not greater than a first pillar width of the first pillar.

In some embodiments, the first pillar width is greater than the second pillar width.

In some embodiments, the first pillar and the second pillar are used in a magnetic random-access memory (MRAM) cell.

In some embodiments, the semiconductor structure further includes a first barrier layer surrounding the first contact pad and a second barrier layer surrounding the second contact pad. The first barrier layer is disposed between the isolation layer and the first contact pad. The second barrier layer is disposed between the isolation layer and the second contact pad.

In some embodiments, the first contact pad and the second contact pad are formed of copper (Cu).

Another aspect of the present disclosure provides a method for is manufacturing a semiconductor structure. The method comprises providing a semiconductor substrate; forming a first pillar and a second pillar over the semiconductor substrate, wherein a first upper surface of the first pillar is higher than a second upper surface of the second pillar; forming an isolation layer over the semiconductor substrate, the first pillar and the second pillar, wherein the isolation layer has a first protrusion over the first pillar and a second protrusion over the second pillar, the first protrusion has a first top surface, the second protrusion has a second top surface, and the first top surface is higher than the second top surface; forming a dielectric layer covering the second top surface of the second protrusion and at least a portion of the first top surface of the first protrusion; performing a first etching process after exposing a portion of the first top surface to form a first contact trench over the first pillar, wherein the isolation layer is etched from the portion of the first top surface over the first pillar; removing a portion of the dielectric layer to expose a portion of the second top surface over the second pillar; performing a second etching process to form a second contact trench over the second pillar, wherein the isolation layer is etched from the portion of the second top surface over the second pillar; depositing a first contact material in the first contact trench to form a first contact pad; and depositing a second contact material in the second contact trench to form a second contact pad.

In some embodiments, the isolation layer over the first pillar and the second pillar is formed by a conformal deposition process.

In some embodiments, the method further includes forming a connecting portion of the isolation layer between the first pillar and the second pillar, wherein the connecting portion has a connecting surface between the first top surface and the second top surface, and the connecting surface is lower than the first is top surface and the second top surface.

In some embodiments, the connecting portion, the first protrusion and the second protrusion are integrally formed.

In some embodiments, the method further includes forming an etch stop layer covering the semiconductor substrate, the first pillar and the second pillar, wherein the isolation layer is formed over the etch stop layer.

In some embodiments, the method further includes removing a first top portion of the etch stop layer over the first pillar after performing the first etching process; and removing a second top portion of the etch stop layer over the second pillar after performing the second etching process.

In some embodiments, the dielectric layer is formed by a spin-on deposition.

In some embodiments, the dielectric layer is formed to cover the first top surface of the first protrusion and the second top surface of the second protrusion.

In some embodiments, the method further includes removing a portion of the dielectric layer to expose the portion of the first top surface over the first pillar before performing the first etching process.

In some embodiments, the isolation layer and the dielectric layer have different etch rates.

In some embodiments, the method further includes completely removing the dielectric layer by a planarization process after performing the second etching process.

In some embodiments, the dielectric layer is removed by a is chemical-mechanical polishing (CMP) process.

With the design of the semiconductor structure of the present disclosure, the widths of contact pads can be adjusted.

In addition, in some embodiments, even though the second pillar width of the second pillar is not greater than the first pillar width of the first pillar, the second pad width of the second contact pad over the second pillar can be greater than the first pad width of the first contact pad over the first pillar.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
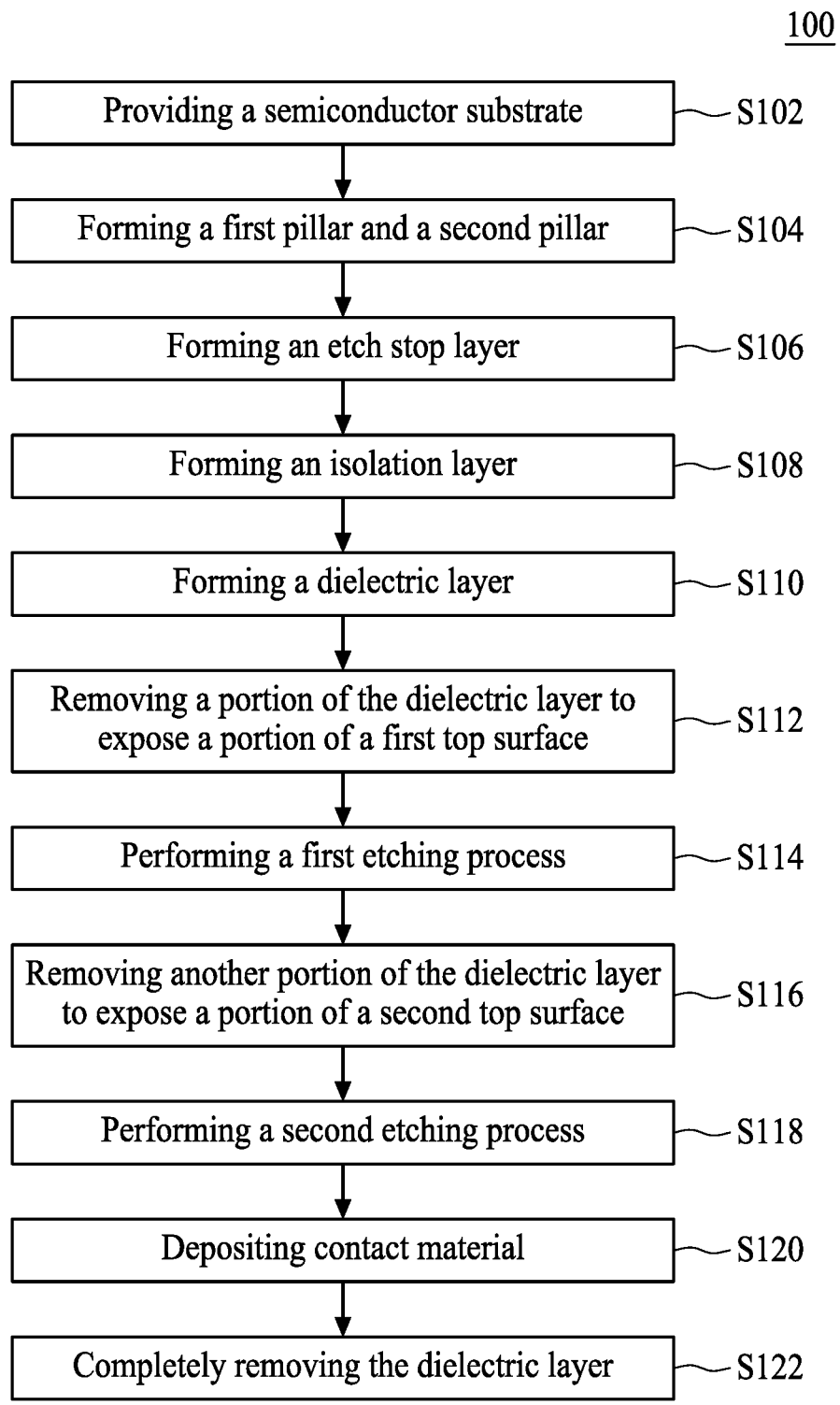
FIG. 1 is a flow diagram illustrating a method for manufacturing a semiconductor structure in accordance with some embodiments of the present is disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

References to "one embodiment," "some embodiments," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

It shall be understood that, although the terms first, second, third, etc. may be used herein to describe various elements, components, regions, layers or sections, these elements, components, regions, layers or sections are not limited by is these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprise" and "comprising," when used in this specification, point out the presence of stated features, integers, steps, operations, elements, or components, but do not preclude the presence or addition of one or more other features, integers, steps, operations, elements, components, or groups thereof.

FIG. 1 is a flow diagram illustrating a method 100 for manufacturing a semiconductor structure in accordance with some embodiments of the present disclosure. FIGS. 2 to 9 are schematic cross-sectional views of stages of manufacturing a semiconductor structure in accordance with some embodiments of the present disclosure. In some embodiments, the method 100 includes a number of operations (s102, s104, s106, s108, s110, s112, s114, s116, s118, s120 and s122), and the description and illustration below are not deemed as a limitation as the sequence of the operations.

Figure 2:
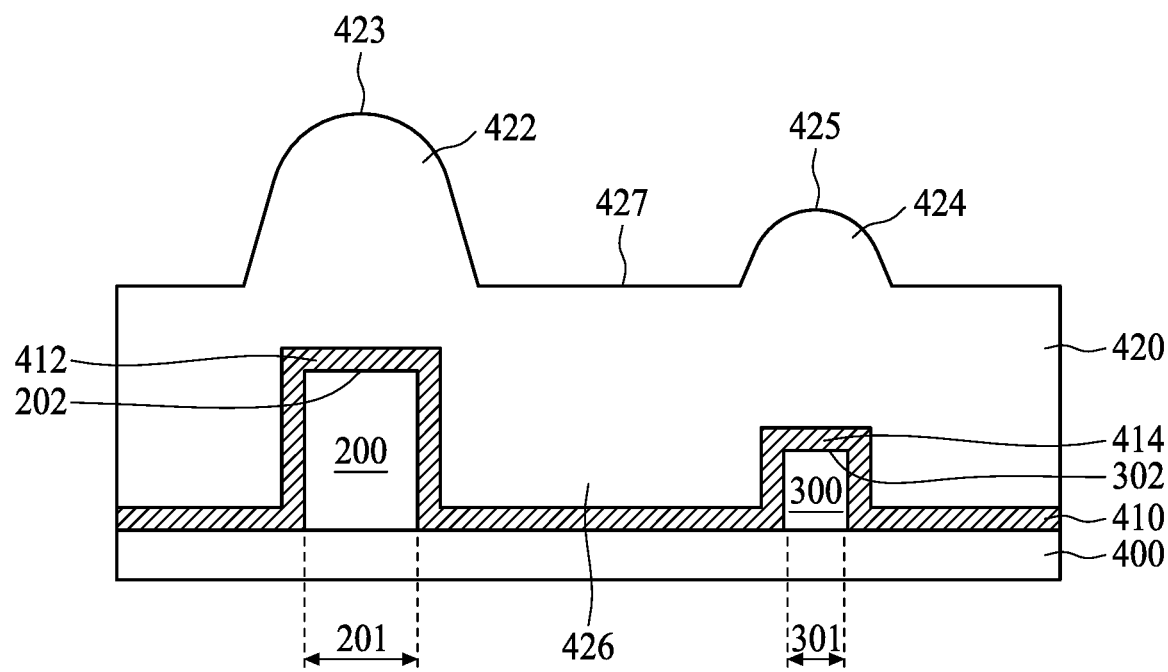
FIGS. 2 to 9 are schematic cross-sectional views illustrating stages of manufacturing a semiconductor structure by the method of FIG. 1 in accordance with some embodiments of the present disclosure.

In operation s102, as shown in FIG. 2, a semiconductor substrate 400 is provided. In some embodiments, the semiconductor substrate 400 is a silicon substrate, a glass substrate, a ceramic substrate, or the like.

In operation s104, as shown in FIG. 2, a first pillar 200 and a second is pillar 300 are formed over the semiconductor substrate 400. A first upper surface 202 of the first pillar 200 is higher than a second upper surface 302 of the second pillar 300. In some embodiments, for MRAM applications, the first pillar 200 and the second pillar 300 include magnetic tunnel junction (MTJ) stacks for magnetic random-access memory (MRAM) cells.

In operation s106, as shown in FIG. 2, an etch stop layer 410 is formed. The etch stop layer 410 covers the semiconductor substrate 400, the first pillar 200 and the second pillar 300. The etch stop layer 410 has a first top portion 412 over the first pillar 200 and a second top portion 414 over the second pillar 300.

In some embodiments, the etch stop layer 410 is formed by a deposition process. In some embodiments, the etch stop layer 410 may be formed of a silicon material, such as silicon oxide (SiO), silicon oxynitride (SiON), silicon oxycarbonitride (SiOCN), or the like.

In operation s108, as shown in FIG. 2, an isolation layer 420 is formed over the etch stop layer 410 over the semiconductor substrate 400, the first pillar 200 and the second pillar 300. In some embodiments, the isolation layer 420 over the first pillar 200 and the second pillar 300 is formed by a conformal deposition process.

The isolation layer 420 has a first protrusion 422 over the first pillar 200 and a second protrusion 424 over the second pillar 300. The first protrusion 422 has a first top surface 423, and the second protrusion 424 has a second top surface 425. The first top surface 423 is higher than the second top surface 425.

In some embodiments, the isolation layer 420 further includes a connecting portion 426 formed between the first pillar 200 and the second pillar 300. The connecting portion 426 has a connecting surface 427 between the first top is surface 423 and the second top surface 425. The connecting surface 427 is lower than the first top surface 423 and the second top surface 425.

In some embodiments, the connecting portion 426, the first protrusion 422 and the second protrusion 424 are integrally formed of oxide material or the like. In some embodiments, the isolation layer 420 and the etch stop layer 410 have different etching rates.

Figure 3:
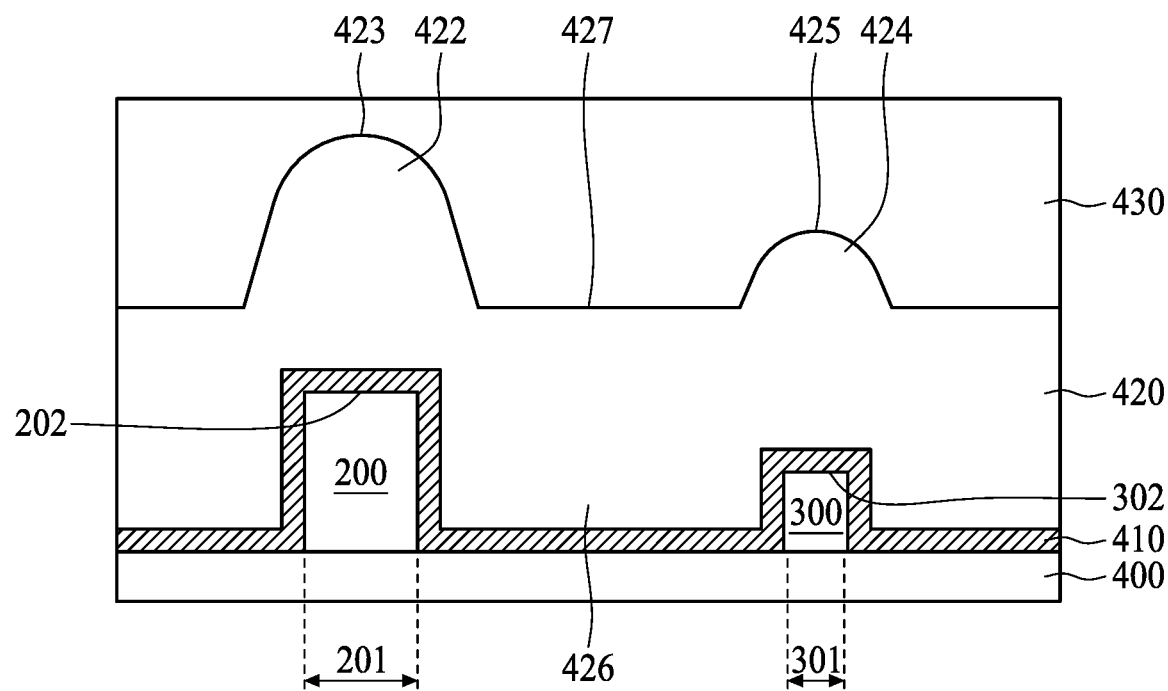

In operation s110, as shown in FIG. 3, a dielectric layer 430 is formed to cover the second top surface 425 of the second protrusion 424 and at least a portion of the first top surface 423 of the first protrusion 422. In some embodiments, the dielectric layer 430 is formed to cover the isolation layer 420 completely, so that the first top surface 423 of the first protrusion 422 and the second top surface 425 of the second protrusion 424 are covered by the dielectric layer 430.

In some embodiments, the dielectric layer 430 is formed by a spin-on deposition, such that a top surface of the dielectric layer 430 is smooth and continuous. In some embodiments, the dielectric layer 430 may include oxide material or other suitable spin-on dielectric material. In some embodiments, the dielectric layer 430 and the isolation layer 420 have different etching rates.

Figure 4:
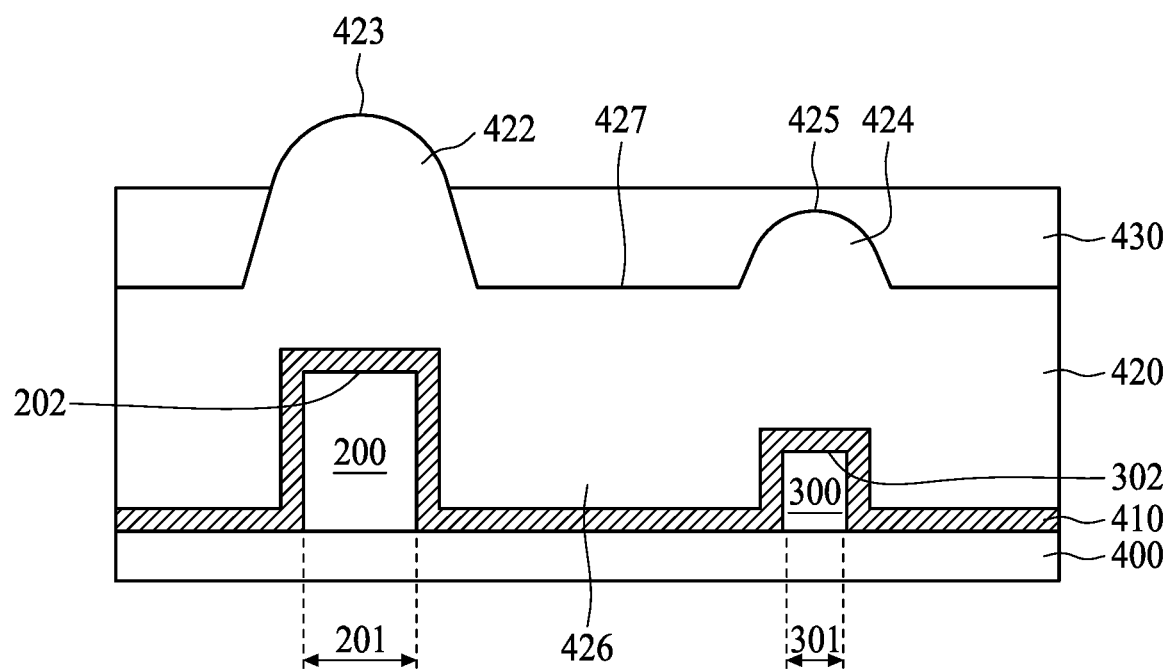

In operation s112, as shown in FIG. 4, a portion of the dielectric layer 430 is removed to expose a portion of the first top surface 423 over the first pillar 200. In some embodiments, the portion of the dielectric layer 430 is removed by an etching process. In some embodiments, a size of the portion of the dielectric layer 430 can be adjusted, so that a size of the exposed portion of the first top surface 423 can be adjusted. In some embodiments, the portion of the first top surface 423 over the first pillar 200 may not be covered by the dielectric layer during the operation is S110, and the operation s112 may be ignored while the portion of the first top surface 423 is exposed.

Figure 5:
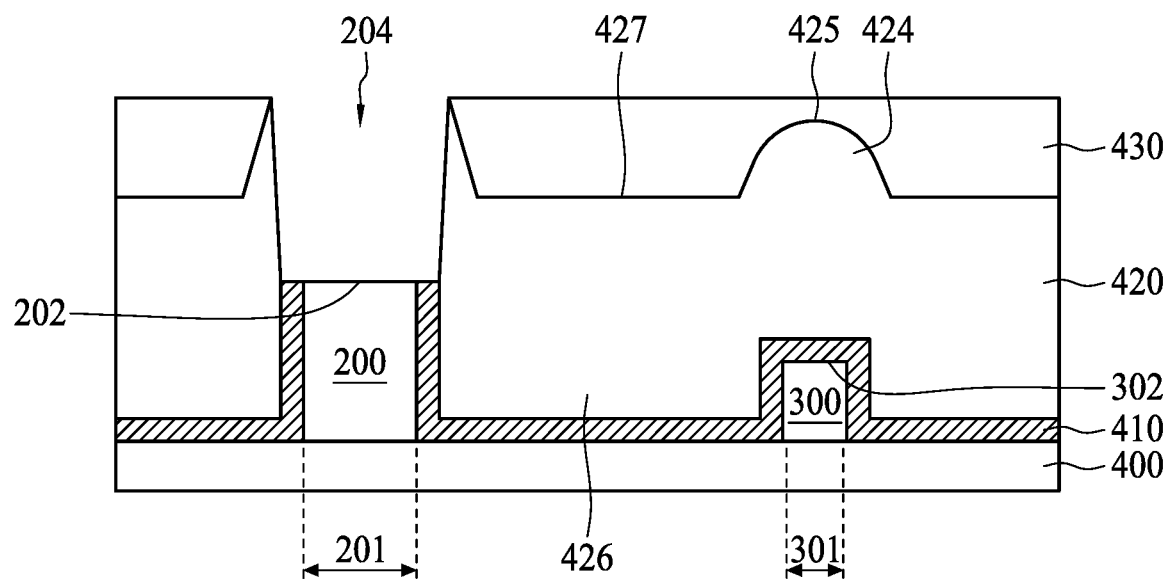

In operation s114, as shown in FIG. 5, after the portion of the first top surface is exposed, a first etching process is performed to form a first contact trench 204 over the first pillar 200. The isolation layer 420 is etched from the portion of the first top surface 423 (shown in FIG. 4) over the first pillar 200. In some embodiments, the first etching process is a self-aligned etching process. Residue of the dielectric layer 430 is used as a mask during the first etching process. In some embodiments, the first top portion of the etch stop layer 410 is removed after the first etching process is performed.

Figure 6:
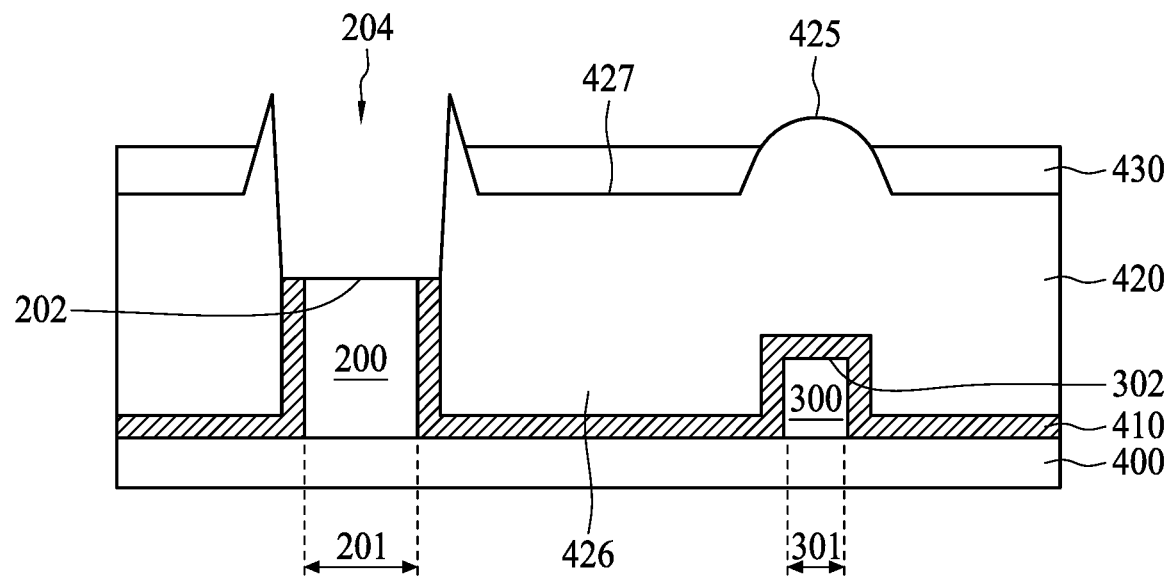

In operation s116, as shown in FIG. 6, another portion of the dielectric layer 430 is removed to expose a portion of the second top surface 425 over the second pillar 300. In some embodiments, the portion of the dielectric layer 430 is removed by an etching process.

Figure 7:
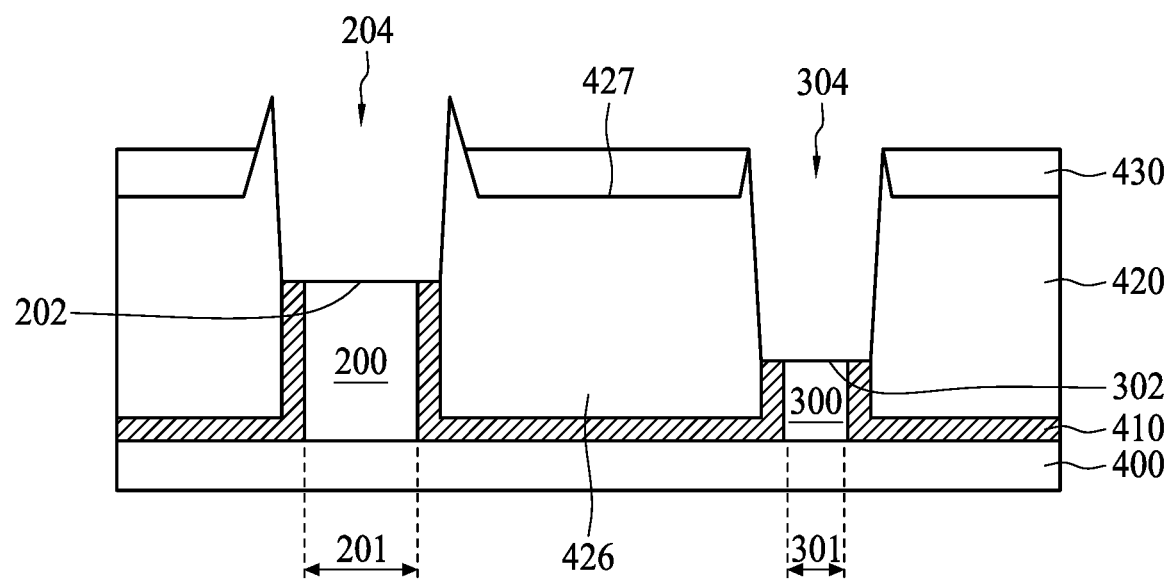

In operation s118, as shown in FIG. 7, a second etching process is performed to form a second contact trench 304 over the second pillar 300. Moreover, the isolation layer 420 is etched from the portion of the second top surface 425 (shown in FIG. 6) over the second pillar 300. In some embodiments, residue of the dielectric layer 430 is used as a mask during the second etching process. The second etching process is a self-aligned etching process. In some embodiments, the second top portion of the etch stop layer 410 is removed after the second etching process is performed.

Figure 8:
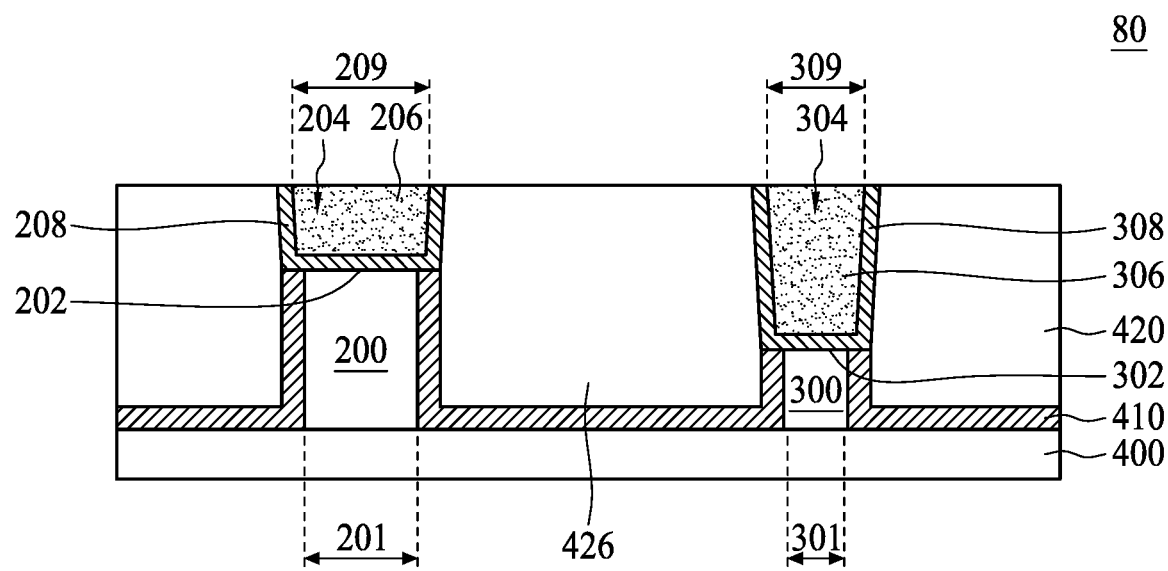

In operation s120, as shown in FIG. 8, a first contact material and a second contact material are deposited in the first contact trench 204 and the second contact trench 304, respectively, to form a first contact pad 206 having a first pad width 209 and a second contact pad 306 having a second pad width 309. In some is embodiments, the first contact pad 206 and the second contact pad 306 are formed of different contact materials. In some embodiments, the contact material may be aluminum (Al), copper (Cu), tungsten (W) or other suitable conductive material. In some embodiments, a first barrier layer 208 and a second barrier layer 308 are formed in the first contact trench 204 and the second contact trench 304, respectively, prior to the depositing of the first contact material and the second contact material. In some embodiments, the first barrier layer 208 and the second barrier layer 308 are formed of tantalum nitride (TaN), cobalt (Co), or the like.

In operation s122, as shown in FIG. 8, the dielectric layer 430 is completely removed by a planarization process after the second etching process is performed. In some embodiments, the dielectric layer is removed by a chemical-mechanical polishing (CMP) process. Thus, the semiconductor structure 80 is formed.

Figure 9:
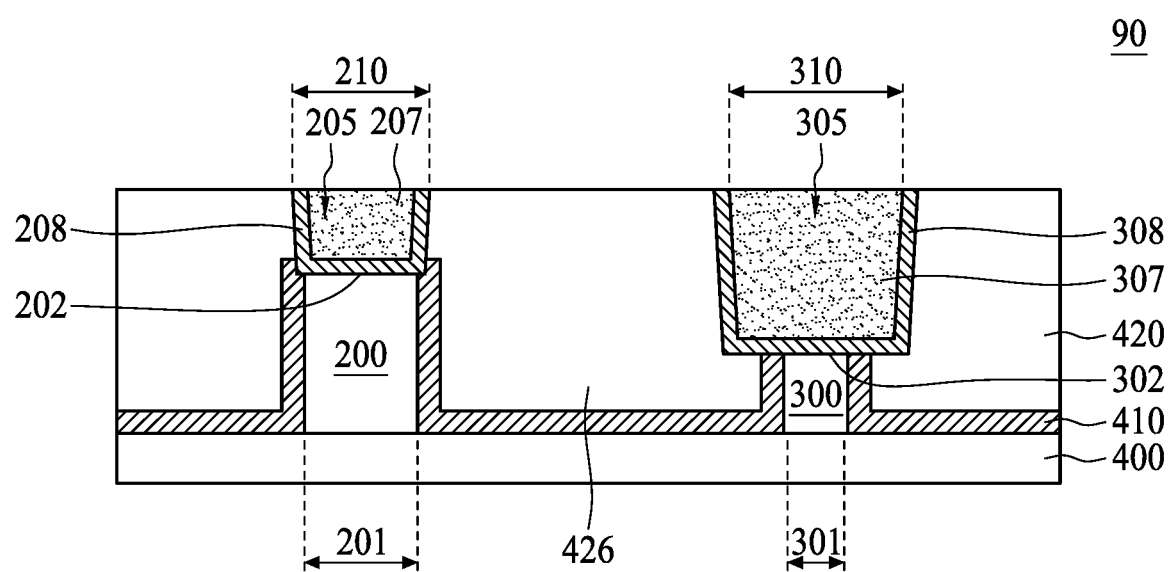

In some embodiments, as shown in FIG. 9, the sizes of the removed portions of the dielectric material in the operations s112, s116 can be adjusted, so that the exposed portion of the first top surface 423 and the exposed portion of the second top surface 425 can be adjusted, and widths of the first contact trench 205 and the second contact trench 305 are changeable. That is, the widths of the first contact pad 207 and the second contact pad 307 can be adjusted by adjusting the sizes of the removed portions of the dielectric layer. In some embodiments, as shown in FIG. 9, even though a first pillar width 201 of the first pillar 200 is greater than a second pillar width 301 of the second pillar 300, the second pad width 310 of the second contact pad 307 is greater than a first pad width 210 of the first contact pad 207. Other operations in a method for manufacturing a semiconductor structure 90 of FIG. 9 are the same as those in the method 100 (except for operations s112, is s116) for manufacturing the semiconductor structure 80 of FIG. 8.

As shown in FIG. 9, the semiconductor structure 90 is provided. The semiconductor structure 90 includes the semiconductor substrate 400, the first pillar 200, the second pillar 300, the isolation layer 420, the first contact pad 207 and the second contact pad 307.

As shown in FIG. 9, the first pillar 200 and the second pillar 300 are disposed over the semiconductor substrate 400. The first upper surface 202 of the first pillar 200 is higher than the second upper surface 302 of the second pillar 300. In some embodiments, a second pillar width 301 of the second pillar 300 is not greater than a first pillar width 201 of the first pillar 200. In some embodiments, the first pillar width 201 of the first pillar 200 is greater than the second pillar width 301 of the second pillar 300. In some embodiments, the first pillar 200 and the second pillar 300 include a magnetic tunnel junction (MTJ) stack for a magnetic random-access memory (MRAM) cell.

As shown in FIG. 9, the isolation layer 420 is disposed over the semiconductor substrate 400. The first pillar 200 and the second pillar 300 are laterally surrounded by the isolation layer 420. In some embodiments, the etch stop layer 410 is disposed between the semiconductor substrate 400 and the isolation layer 420. The first pillar 200 and the second pillar 300 are laterally surrounded by the etch stop layer 410.

As shown in FIG. 9, the first contact pad 207 is embedded in the isolation layer 420. The first contact pad 207 is disposed over the first pillar 200.

As shown in FIG. 9, the second contact pad 307 is embedded in the isolation layer 420. The second contact pad 307 is disposed over the second pillar 300, and a first pad width 210 of the first contact pad 207 is not greater than a second pad width 310 of the second contact pad 307. In some embodiments, the first contact is pad 207 and the second contact pad 307 are formed of copper (Cu).

In some embodiments, the first contact pad 207 is surrounded by the first barrier layer 208. The first barrier layer 208 is disposed between the isolation layer 420 and the first contact pad 207. In some embodiments, the second contact pad 307 is surrounded by the second barrier layer 308. The second barrier layer 308 is disposed between the isolation layer 420 and the second contact pad 307.

In conclusion, with the configuration of the semiconductor structure of the present disclosure, the widths of the contact pads can be adjusted by adjusting the sizes of the removed portions of the dielectric layer. In some embodiments, even though the second pillar width of the second pillar is not greater than the first pillar width of the first pillar, the second pad width of the second contact pad over the second pillar can be greater than the first pad width of the first contact pad over the first pillar.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

One aspect of the present disclosure provides a semiconductor structure. The semiconductor structure comprises a semiconductor substrate; a first pillar and a second pillar over the semiconductor substrate, wherein a first upper surface of the first pillar is higher than a second upper surface of the second pillar; an isolation layer over the semiconductor substrate, wherein the first pillar and the second pillar are laterally surrounded by the isolation layer; a first contact pad embedded in the is isolation layer, wherein the first contact pad is disposed over the first pillar; and a second contact pad embedded in the isolation layer, wherein the second contact pad is disposed over the second pillar, and a first pad width of the first contact pad is not greater than a second pad width of the second contact pad.

Another aspect of the present disclosure provides a method for manufacturing a semiconductor structure. The method comprises providing a semiconductor substrate; forming a first pillar and a second pillar over the semiconductor substrate, wherein a first upper surface of the first pillar is higher than a second upper surface of the second pillar; forming an isolation layer over the semiconductor substrate, the first pillar and the second pillar, wherein the isolation layer has a first protrusion over the first pillar and a second protrusion over the second pillar, the first protrusion has a first top surface, the second protrusion has a second top surface, and the first top surface is higher than the second top surface; forming a dielectric layer covering the second top surface of the second protrusion and at least a portion of the first top surface of the first protrusion; performing a first etching process after exposing a portion of the first top surface to form a first contact trench over the first pillar, wherein the isolation layer is etched from the portion of the first top surface over the first pillar; removing a portion of the dielectric layer to expose a portion of the second top surface over the second pillar; performing a second etching process to form a second contact trench over the second pillar, wherein the isolation layer is etched from the portion of the second top surface over the second pillar; depositing a first contact material in the first contact trench to form a first contact pad; and depositing a second contact material in the second contact trench to form a second contact pad.

The scope of the present application is not intended to be limited to the particular embodiments of the process, machine, manufacture, composition of is matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A method for manufacturing a semiconductor structure, comprising:
    providing a semiconductor substrate;
    forming a first pillar and a second pillar over the semiconductor substrate, wherein a first upper surface of the first pillar is higher than a second upper surface of the second pillar;
    forming an isolation layer over the semiconductor substrate, the first pillar and the second pillar, wherein the isolation layer has a first protrusion over the first pillar and a second protrusion over the second pillar, the first protrusion has a first top surface, the second protrusion has a second top surface, and the first top surface is higher than the second top surface;
    forming a dielectric layer covering the second top surface of the second protrusion and at least a portion of the first top surface of the first protrusion;
    performing a first etching process after exposing a portion of the first top surface to form a first contact trench over the first pillar, wherein the isolation layer is etched from the portion of the first top surface over the first pillar;
    removing a portion of the dielectric layer to expose a portion of the second top surface over the second pillar;
    performing a second etching process to form a second contact trench over the second pillar, wherein the isolation layer is etched from the portion of the second top surface over the second pillar;
    depositing a first contact material in the first contact trench to form a first contact pad; and
    depositing a second contact material in the second contact trench to form a second contact pad.

2. The method of claim 1, wherein the isolation layer and the dielectric layer have different etch rates.

3. The method of claim 1, wherein the isolation layer over the first pillar and the second pillar is formed by a conformal deposition process.

4. The method of claim 3, further comprising:
forming a connecting portion of the isolation layer between the first pillar and the second pillar, wherein the connecting portion has a connecting surface between the first top surface and the second top surface, and the connecting surface is lower than the first top surface and the second top surface.

5. The method of claim 4, wherein the connecting portion, the first protrusion and the second protrusion are integrally formed.

6. The method of claim 1, further comprising:
forming an etch stop layer covering the semiconductor substrate, the first pillar and the second pillar, wherein the isolation layer is formed over the etch stop layer.

7. The method of claim 6, further comprising:
removing a first top portion of the etch stop layer over the first pillar after performing the first etching process;

removing a second top portion of the etch stop layer over the second pillar after performing the second etching process.

8. The method of claim 1, wherein the dielectric layer is formed by a spin-on deposition.

9. The method of claim 8, wherein the dielectric layer is formed to cover the first top surface of the first protrusion and the second top surface of the second protrusion.

10. The method of claim 9, further comprising:
removing a portion of the dielectric layer to expose the portion of the first top surface over the first pillar before performing the first etching process.

11. The method of claim 1, further comprising:
completely removing the dielectric layer by a planarization process after performing the second etching process.

12. The method of claim 11, wherein the dielectric layer is removed by a chemical-mechanical polishing (CMP) process.

* * * * *